United States Patent
Liao

[19]

[11] Patent Number: 5,990,525
[45] Date of Patent: *Nov. 23, 1999

[54] ROM DEVICE STRUCTURE COMPRISED OF ROM MEMORY ARRAY CELLS, FEATURING CONCAVE CHANNEL REGIONS

[75] Inventor: Siu-han Liao, Hsia-Chu, Taiwan

[73] Assignee: Taiwan Semiconductor Manufacturing Company, Ltd., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/822,666

[22] Filed: Mar. 24, 1997

Related U.S. Application Data

[62] Division of application No. 08/663,575, Jun. 13, 1996, Pat. No. 5,652,162.

[51] Int. Cl.$^6$ .......................... H01L 29/76; H01L 29/94; H01L 31/062; H01L 31/113
[52] U.S. Cl. .......................... 257/390; 257/330; 257/331; 257/345
[58] Field of Search .................................. 257/390, 330, 257/331, 332, 345

[56] References Cited

U.S. PATENT DOCUMENTS

| | | | |
|---|---|---|---|
| 5,214,303 | 5/1993 | Aoki | 257/390 |
| 5,300,804 | 4/1994 | Arai | 257/332 |
| 5,448,094 | 9/1995 | Hsu | 257/330 |
| 5,498,556 | 3/1996 | Hong et al. | 437/35 |
| 5,654,576 | 8/1997 | Hsue et al. | 257/390 |

FOREIGN PATENT DOCUMENTS

| | | | |
|---|---|---|---|
| 56-13772 | 2/1981 | Japan | 257/345 |

*Primary Examiner*—Steven H. Loke
*Attorney, Agent, or Firm*—George O. Saile; Stephen B. Ackerman

[57] ABSTRACT

A ROM device structure, featuring a ROM memory cell, with the ROM memory cell exhibiting a concave shaped, channel region, has been developed. The ROM device structure is comprised of heavily doped, N type, bit line regions, located in flat regions of the ROM device structure, while lightly doped, P type regions. comprise the concave channel region for the ROM memory cell. The ROM device structure offers self-alignment of the P type, concave channel regions, to the heavily doped N type, bit line regions.

1 Claim, 8 Drawing Sheets

ROM DEVICE STRUCTURE COMPRISED OF ROM MEMORY ARRAY CELLS, FEATURING CONCAVE CHANNEL REGIONS

This application is a divisional application of ser. No. # 08/663,575, Filed on Jun. 13, 1996, issued as U.S. Pat. No. 5,652,162.

BACKGROUND OF THE INVENTION (1) Field of the Invention

The present invention relates to a process for fabricating read only memory, (ROM), devices, and more specifically to a semiconductor fabrication process designed to create ROM memory cell arrays with a concave channel region.

(2) Description of Prior Art

The semiconductor industry is continually striving to increase chip performance while still maintaining the fabrication cost of the specific semiconductor chip. These objectives are being successfully addressed by the trend to micro-miniaturazation, or the ability to create semiconductor devices, with sub-micron features. This has been accomplished by advances in specific semiconductor fabrication disciplines, such as photolithography and reactive ion etching, (RIE). For example advanced exposure cameras, as well as the development of more sensitive photoresist materials, have allowed sub-micron features to be routinely created in photoresist layers. In addition the development of advanced dry etching apparatus and processes, have in turn resulted in the successful transfer of the sub-micron images in photoresist layers, to underlying materials, used in the fabrication of advanced semiconductor devices.

The read only memory, (ROM), technology has benefitted by use of micro-miniaturazation. The density of ROM memory arrays, consisting of individual ROM cells, has been increasing due to the ability to create and successfully utilize ROM devices with sub-micron features. The smaller ROM cells result in performance increases, due to decreases in parasitic capacitances, as well as decreases in cell resistances. In addition the smaller ROM cells result in smaller chips, therefore allowing more chips to be obtained from a specific size semiconductor substrate, thus reducing the fabrication cost of a specific chip. However the use of smaller ROM devices also offers specific reliability and yield issues, not encountered with larger dimension ROM counterparts. For example, the ability to create polysilicon gate structures, with sub-micron features, allows narrow channel lengths to be achieved. However the narrow channel lengths increase the reliability risk in terms of hot carrier effects. In addition the short channel effects, and punchthrough leakages, negatively influence yield.

This invention will describe a process for creating ROM devices, benefitting from the use of sub-micron features, but minimizing the risk of reliability and yield problems, encountered with narrow channel lengths. This is achieved via use of a flat ROM device, fabricated with ROM memory array cells featuring a concave channel. The use of the concave channel increases the channel length of a specific ROM cell, thus minimizing the yield and reliability concerns of narrower channels, while still not increasing the size of the specific ROM cell. Therefore this concept allows increased ROM densities, as well as minimized reliability and yield risks, to be obtained.

The present invention will describe a process for forming concave channels, for ROM devices, using the growth and subsequent removal of a field oxide region. A self-aligned bit line structure, self-aligned using the field oxide as a mask, is also a key feature of this invention. Hsu, in U.S. Pat. No. 5,448,094, describes a process of forming concave channel, metal oxide semiconductor, (MOS), transistors, however Hsu does not describe a process in which a self-aligned bit line is formed in combination with the concave channel structure. In addition, Arai, in U.S. Pat. No. 5,300,804, and Aoki, in U.S. Pat. No. 5,214,303, both describe forming ROM devices, created with flat channels, thus not benefitting from the concave channel concept, in terms of increased density and reduced reliability risk.

SUMMARY OF THE INVENTION

It is an object of this invention to increase the density of ROM memory arrays, by the fabrication of ROM cells with sub-micron features.

It is another object of this invention to provide a ROM memory array cell which has a concave channel, to increase the effective channel length of the device.

It is still another object of this invention to use bit lines, self-aligned to the concave channel regions, in the ROM memory array cell.

In accordance with the present invention a method is described for fabricating a semiconductor chip with logic areas, and ROM memory arrays, with the ROM memory arrays containing concave channels, as well as bit lines, self-aligned to the concave channels. Field oxide regions are formed in the semiconductor chip. Heavily doped N+ bit lines are formed in the region of the semiconductor chip, to be used for the ROM memory arrays, and not covered by field oxide. The field oxide regions are then removed in the ROM memory array region, via wet chemical etching. A lightly doped P type ion implantation is performed in the ROM memory array region, in regions in which the field oxide had been removed, to prevent punchthrough between bit lines. A blanket ion implantation step is performed to adjust the threshold voltage of both the ROM memory array, as well as ROM logic region devices. A gate oxide is then grown, followed by the deposition, and doping of a polysilicon layer. Patterning of the polysilicon layer is accomplished via photolithographic and RIE procedures, producing polysilicon gate structures for both the ROM memory array and logic regions. Source and drain regions are then formed in the logic region of the semiconductor chip.

BRIEF DESCRIPTION OF THE DRAWINGS

The object and other advantages of this invention are best described in the preferred embodiments with reference to the attached drawings that include:

FIGS. 1a–7a, which schematically, in cross-sectional style, show the stages of fabrication of devices used for the logic region of the ROM device.

FIGS. 1b–7b, which schematically, in cross-sectional style, show the stages of fabrication of the ROM memory array cells, with the concave channels.

DESCRIPTION OF THE PREFERRED EMBODIMENTS

Figure 1A:
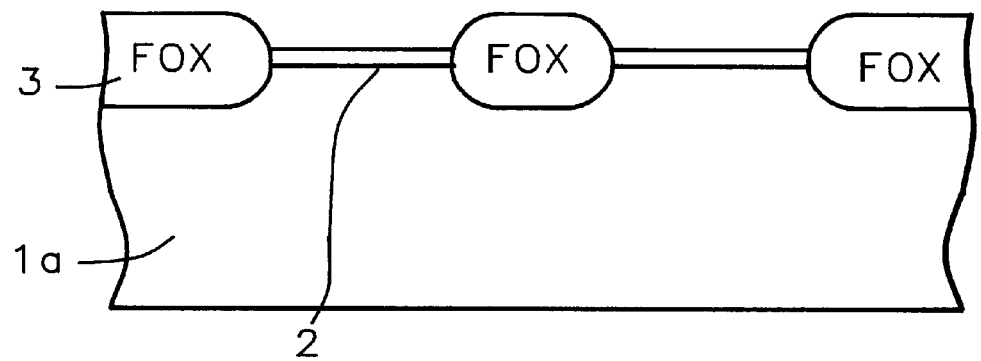
Figure 1B:
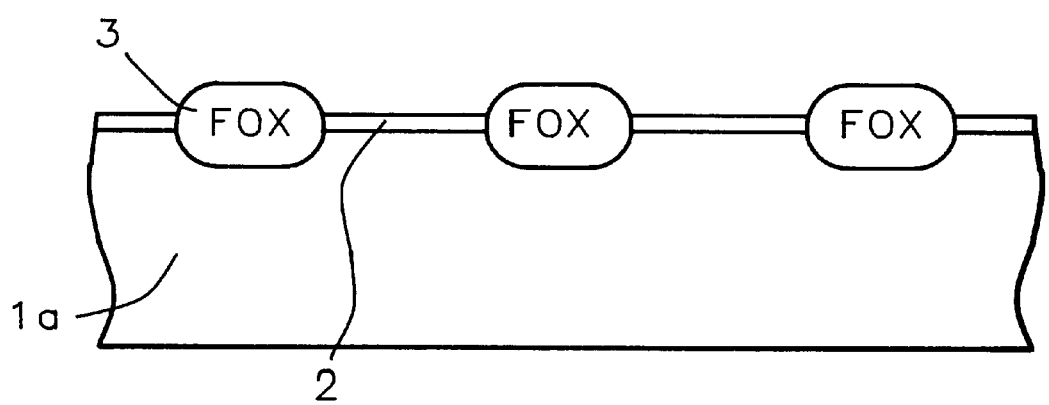

The method of forming flat ROM devices, with ROM memory array cells, containing concave channels, will now be covered in detail. A P type substrate, 1, composed single crystalline silicon, with a <100> crystallographic orientation, is used, and shown in FIG. 1a, for the logic region of the ROM device, and in FIG. 1b, for the ROM memory array. A silicon oxide layer, 2, is thermally grown at a temperature between about 850, to 1050° C., to a thickness between about 100 to 300 Angstroms, to be used as an underlying pad oxide, for a subsequent field oxidation procedure, as well as being used as a screen oxide, for subsequent ion implantation processes. A silicon nitride layer, (not shown), is next deposited using either low pressure chemical vapor deposition, (LPCVD), or plasma enhanced chemical vapor deposition, (PECVD), processing, at a temperature between about 700 to 850° C., to a thickness between about 1000 to 2000 Angstroms. The silicon nitride—silicon oxide layers are then patterned using standard photolithographic and RIE procedures, to create a silicon nitride silicon oxide, oxidation mask, (not shown in FIGS. 1a and 1b). After removal of the photoresist layer, using plasma oxygen ashing and careful wet cleans, FOX region, 3, is thermally grown in an oxygen—steam ambient, at a temperature between about 950 to 1050° C., to a thickness between about 3000 to 6000 Angstroms, shown schematically in FIGS. 1a and 1b. After the creation of FOX region, 3, the silicon nitride layer, used as the oxidation mask for the growth of the FOX region, is removed using hot phosphoric acid.

Figure 2A:
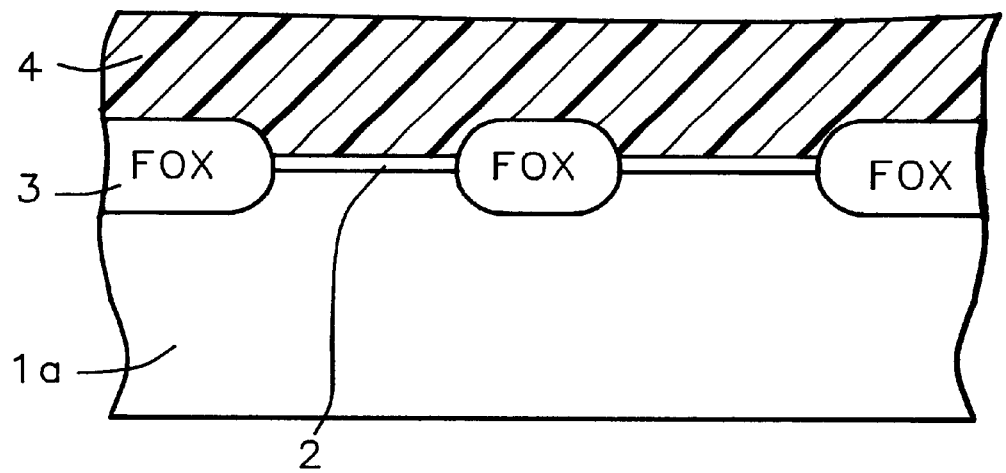
Figure 2B:
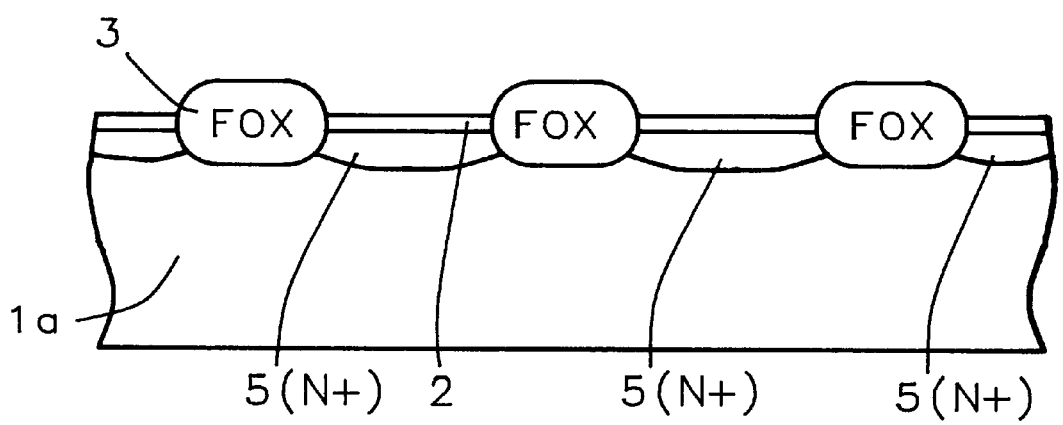
Figure 3A:
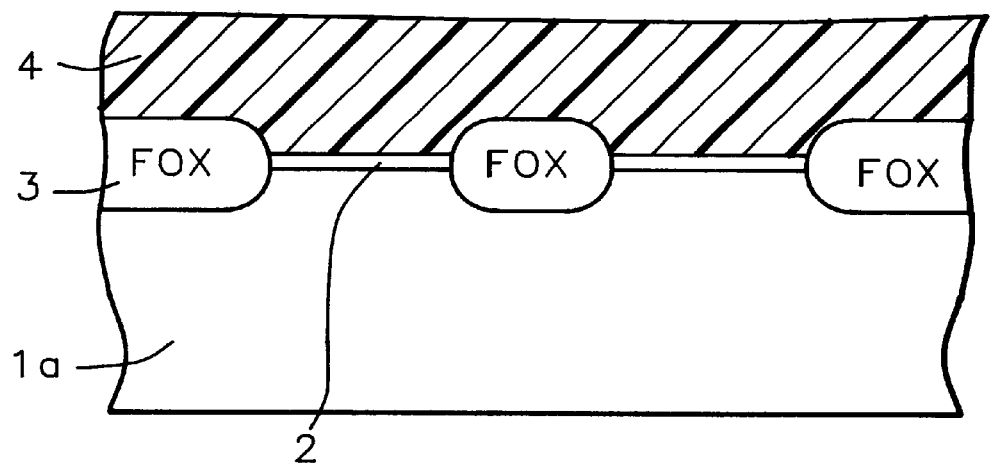
Figure 3B:
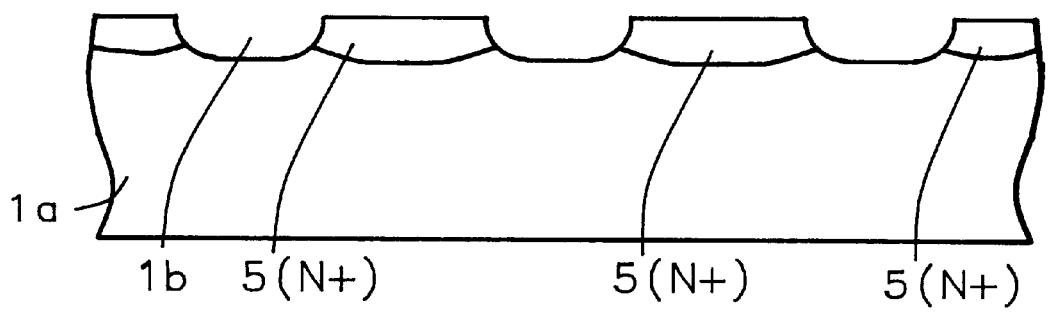

A photoresist layer, 4, is next applied to mask the logic regions of the ROM device. This is schematically shown in FIG. 2a. A ion implantation of arsenic is next performed, at an energy between about 30 to 70 KeV, at a dose between about 1E15 to 3E15 atoms/cm$^2$, to create heavily doped N+, bit lines, 5, for the ROM memory array cells. This is schematically illustrated in FIG. 2b. The N+ bit lines, 5, are self-aligned to the FOX regions, 3, and the subsequent removal of FOX region, 3, creating a concave region in semiconductor substrate, 1, to be used for the channel region of a ROM memory array cell, will result in the self-alignment of bit lines, 5, to the ROM memory array cell channel. FIG. 3b, shows the result of removal of FOX region, 3, creating a concave shape, 1b, on the flat surface of semiconductor substrate, 1a, between N+ bit lines, 5. The FOX removal was accomplished via the use of a buffered hydrofluoric acid solution, also resulting in the removal of silicon oxide layer, 2, from the top surface of N+ bit lines, 5. Silicon oxide layer, 2, and FOX region, 3, were protected by photoresist layer, 4, in the logic regions of the ROM device area, and thus were not removed during the buffered hydrofluoric acid procedure. This is schematically shown in FIG. 3a. The depth of the concave channel region, below the top surface of the bit line regions, is approximately half the thickness of the FOX region, between about 1000 to 3000 Angstroms, a length of the concave channel region, between about 0.2 to 1.0 μm.

Figure 4A:
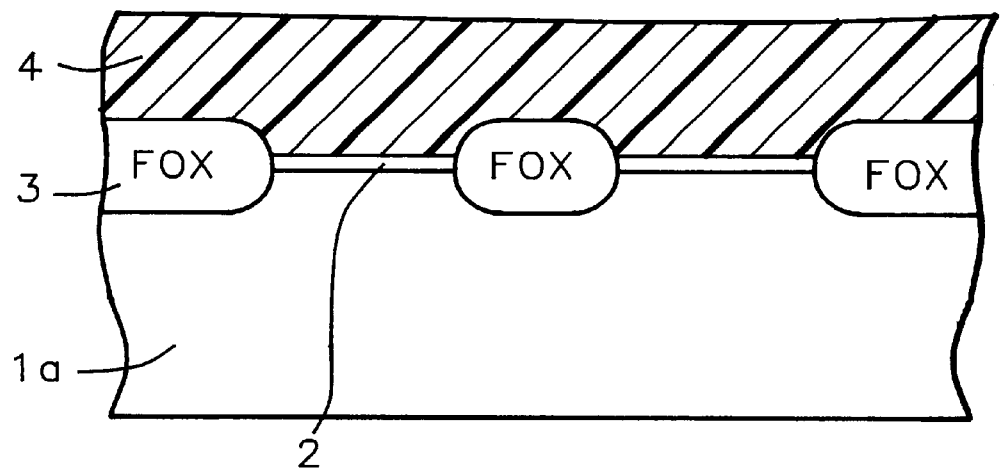
Figure 4B:
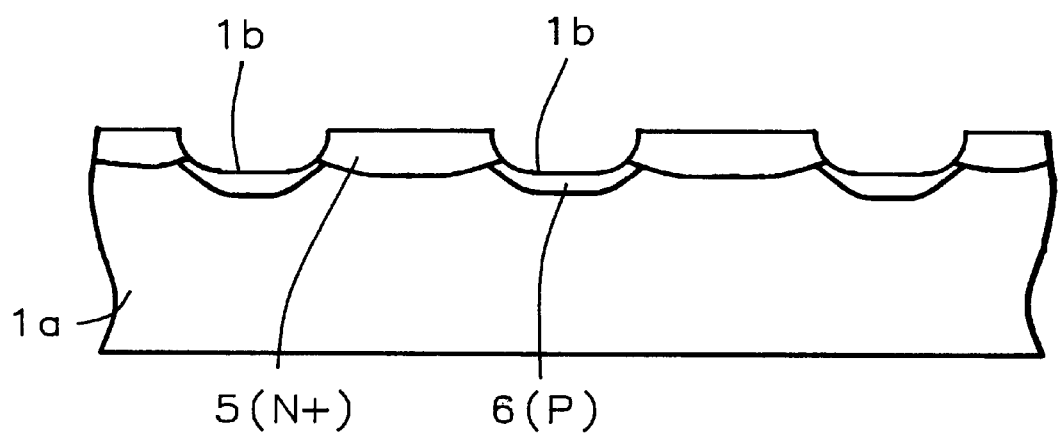

FIG. 4b, shows the result of another ion implantation procedure, using boron, at an energy between about 70 to 120 KeV, at a dose between about 5E12 to 2E13 atoms/cm$^2$, applied only to the ROM memory array cells. The logic regions of the ROM device are protected from this ion implantation procedure by photoresist layer, 4, shown schematically in FIG. 4a. This implantation procedure, producing the cell anti-punchthrough, (CPT), region, results in a P type region, 6, being created between N+ bit line regions, 5, and also being self-aligned to N+ bit line regions, 5. The lightly doped implantation, creating P type region, 6, also penetrates N+ bit line region, 5, however due to the lower doping level dose not influence the N+ bit line regions. Photoresist layer, 4, is removed using plasma oxygen ashing, and careful wet cleans.

Figure 5A:
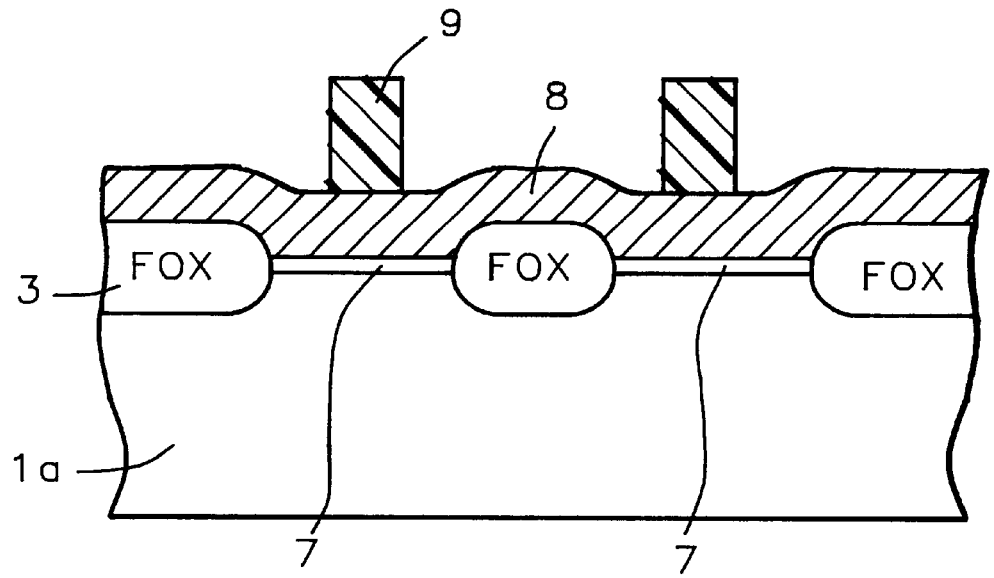
Figure 5B:
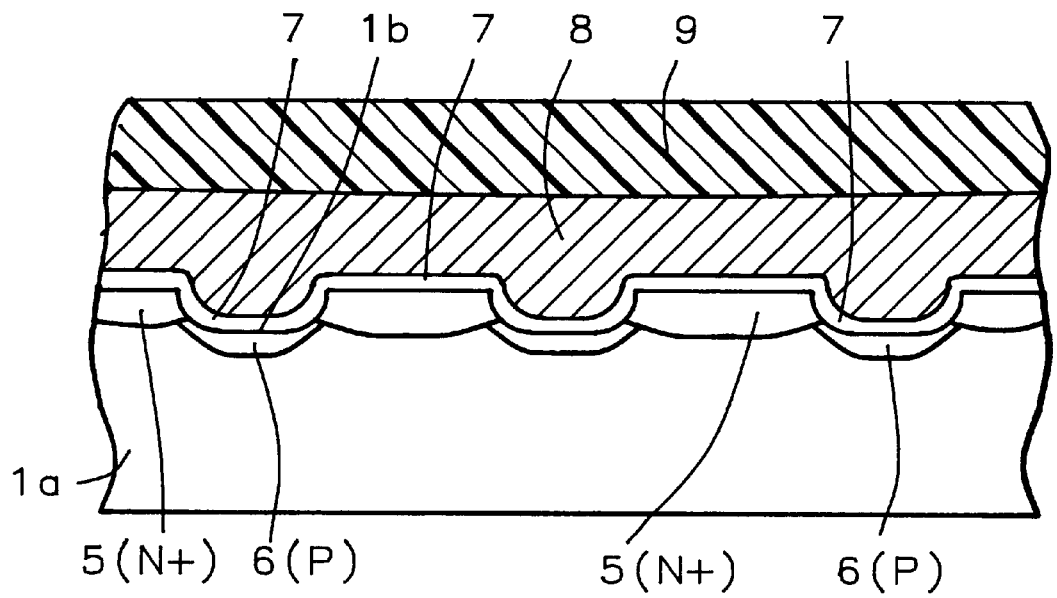

An ion implantation procedure, used to adjust the threshold voltage of the MOSFET devices of the logic region, as well as the threshold voltage of ROM cell region, is next performed using BF$_2$, at an energy between about 50 to 90 KeV, at a dose between about 1E12 to 4E12 atoms/cm$^2$. These steps are not shown in the drawings. A buffered hydrofluoric acid treatment, is next used to remove silicon oxide layer, 2, from ROM logic regions. Another silicon dioxide layer, 7, to be used as a gate insulator, is then thermally grown, in an oxygen—steam ambient, at a temperature between about 800 to 1000° C., to a thickness between about 70 to 200 Angstroms. This is shown in FIG. 5a, for the logic regions of the ROM device, as well as in FIG. 5b, for the ROM memory array cells. A polysilicon layer, 8, is next deposited using LPCVD procedures, at a temperature between about 550 to 650° C., to a thickness between about 1000 to 3000 Angstroms. The polysilicon can be deposited either by using insitu doping procedures, by addition of either arsine or phosphine to a silane ambient, or by growing an intrinsic layer of polysilicon, and doping via a phosphorous or arsenic ion implantation procedure, at an energy between about 25 to 75 KeV, at a dose between about 1E14 to 5E15 atoms/cm$^2$. Polysilicon layer, 8, is used for, and shown for both the logic regions of the ROM device, in FIG. 5a, as well the ROM memory array cells, in FIG. 5b. Photoresist layer, 9, is next applied and used a mask for subsequent RIE procedures to be used to produce polysilicon gate structures for the logic regions of the ROM device, shown schematically in FIG. 5a. The desired polysilicon configuration, is also obtained for the ROM memory array cells. However in FIG. 5b, the polysilicon gate structure, 8, is shown overlying silicon dioxide, gate insulator layer, 7, while traversing both N+ bit line regions, 5, and P type regions, 6.

Figure 6A:
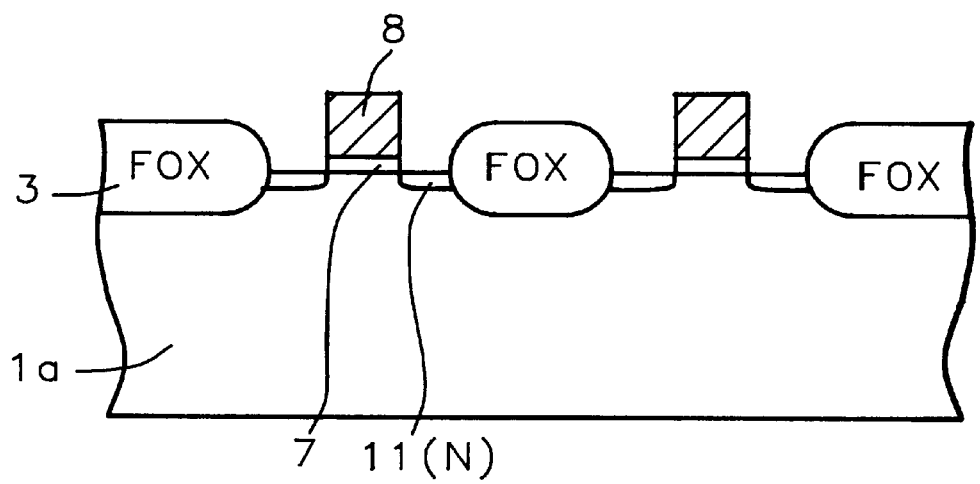
Figure 6B:
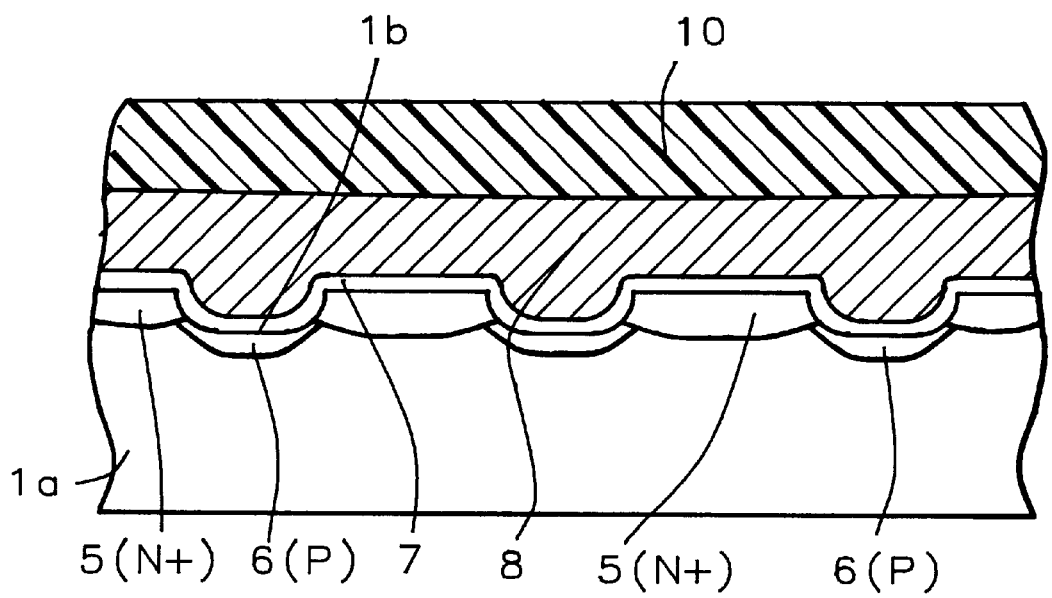

Polysilicon layer, 8, is next patterned, via RIE procedures, using Cl$_2$ as an etchant, producing the desired gate structures for both the logic regions of the ROM device, as well for the ROM memory array cells. After removal of photoresist layer, 9, via use of plasma oxygen ashing and careful wet cleans, another photoresist layer, 10, shown schematically in FIG. 6b, is used to blockout the ROM memory array cells, as well as to blockout ROM logic regions that will be used for P channel, (PFET), devices. A lightly doped source and drain region, 11, for the N channel, (NFET) devices, is formed in the NFET, ROM logic regions, via ion implantation of phosphorous, at an energy between about 30 to 70 KeV, at a dose between about 5E12 to 5E13 atoms/cm$^2$. This is shown schematically in FIG. 6a. Photoresist layer, 10, is than removed via plasma oxygen ashing and careful wet cleans. (Not shown in the drawings is another photoresist procedure used to blockout the ROM memory array cells, as well as to blockout ROM logic regions used for NFET devices. An ion implantation of BF$_2$ is used at an energy between about 30 to 70 KeV, at a dose between about 5E12 to 5E13 atoms/cm, to produce a lightly doped source and drain region for the PFET devices. The photoresist blockout mask is then removed via plasma oxygen ashing and careful wet cleans).

Figure 7A:
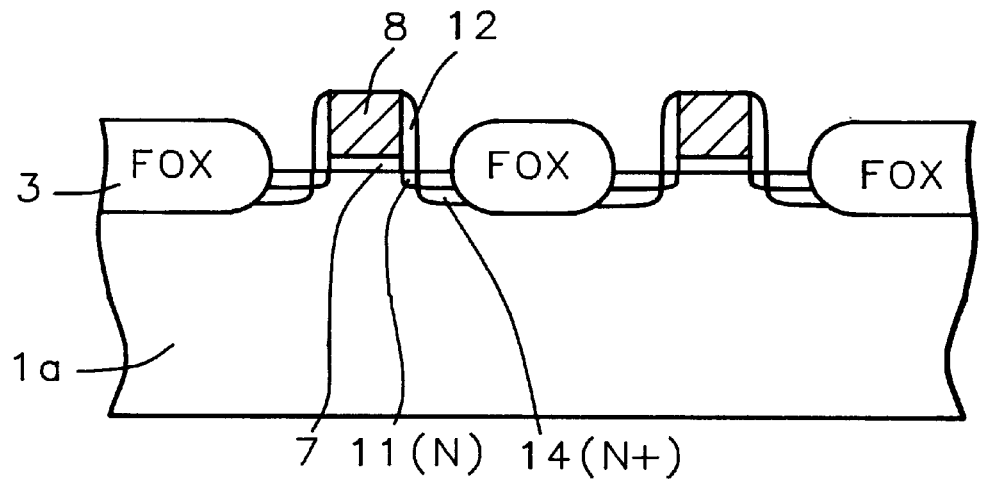
Figure 7B:
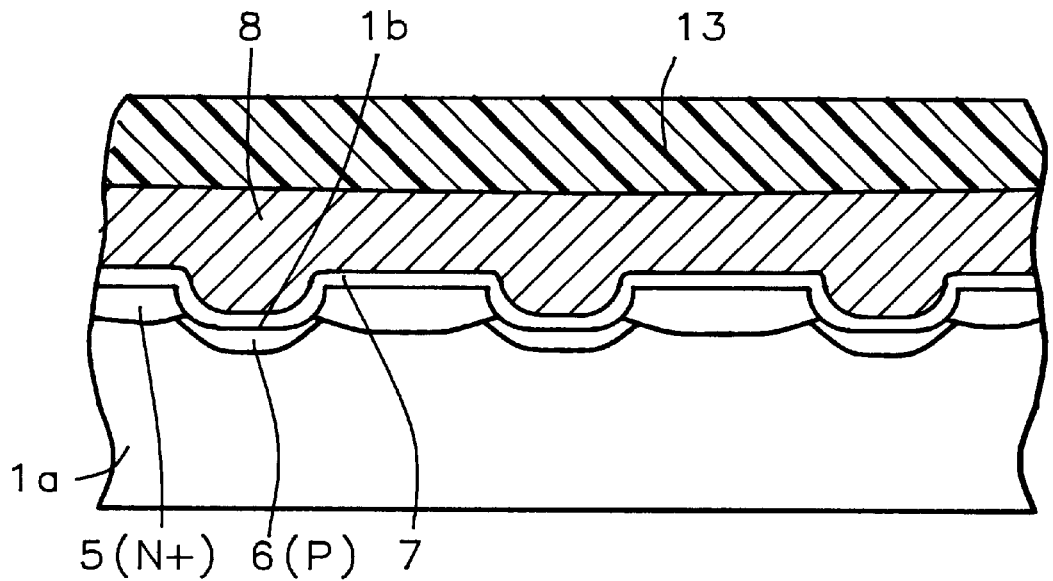

Next a deposition of silicon oxide is performed using either LPCVD or PECVD procedures, at a temperature between about 650 to 750° C., to a thickness between about 1000 to 3000 Angstroms, using tetraethylorthosilicate, (TEOS), as a source. An anisotropic RIE procedure, using CHF$_3$ as an etchant, is next used to produce insulator spacer, 12, on the sidewalls of polysilicon gate structure, 8, shown schematically for the logic regions of the ROM device in FIG. 7a. Insulator spacer, 12, is also formed on the sidewalls of polysilicon gate structure, 8, for the ROM memory array cells, however this can not be seen in the cross-sectional view in FIG. 7b. Another photoresist layer, 13, shown in FIG. 7b, is again used as a blockout mask to allow heavily doped source and drain regions, 14, to be created only for the NFET devices, in the logic regions of the ROM device. Heavily doped source and drain region, 14, is formed via ion implantation of arsenic, at an energy between about 30 to 70 KeV, at a dose between about 1E15 to 5E15 atoms/cm$^2$. Removal of photoresist layer, 13, is again accomplished via plasma oxygen ashing. (Again not shown in the drawings is another photoresist blockout mask, used to create the heavily doped source and drain regions for the PFET devices, in the logic regions of the ROM device. This is accomplished via an ion implantation of BF$_2$, at an energy between about 30 to 70 KeV, at a dose between about 1E15 to 4E15 atoms/cm$^2$. Photoresist is once again remove via plasma oxygen ashing and careful wet cleans).

Figure 8:
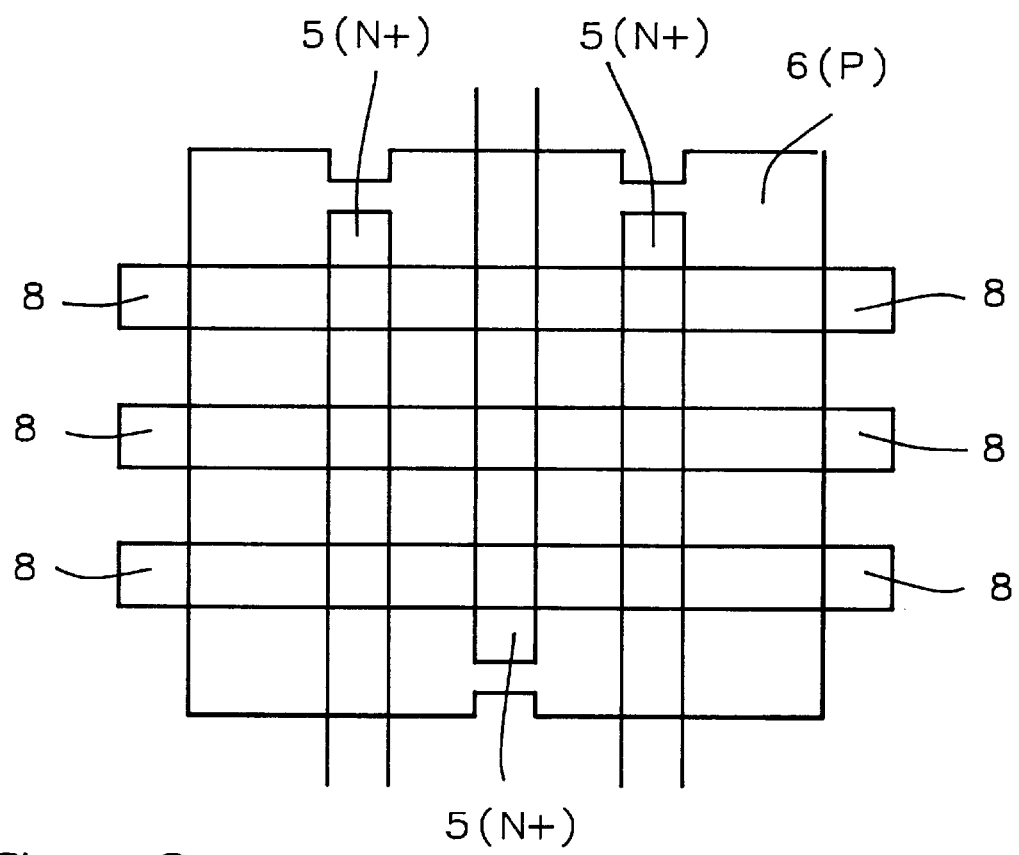
FIG. 8, which is a top view of a ROM memory array cell, with the concave channels.

FIG. 8, shows the top view of the ROM memory array cells. It can be seen that a series of connected of enhancement, (polysilicon gate structure overlying N+ bit lines), comprise the ROM memory array cells. The ability to create a concave channel, allows a longer channel length to be obtained, when compared to flat channel counterparts, without increasing the amount of needed area. The longer channel lengths reduces the risk of hot electron injection, as well as other short channel effects. In addition the ability to self-align the N+ bit lines concave channels, saves a masking step, as well allowing ROM memory array cell density to increase.

This invention for fabricating flat ROM devices, comprised of ROM memory array cells with concave channels, although shown for N type bit lines and channels, can also be used for ROM devices, with P type bit lines and channels. It should also be noted that this invention, concave channels, and self-aligned bit lines, can also be applied to other MOSFET designs, other than ROM configurations.

While this invention has been particularly shown and described with reference to the preferred embodiments thereof, it will be understood by those skilled in the art that various changes in form and details may be made without departing from the spirit and scope of this invention.

What is claimed is:

1. A ROM device structure, on a semiconductor substrate, comprised of cell anti-punchthrough, (CPT), region, located in concave regions in said semiconductor substrate, and comprised with N type, bit line regions, on a flat region of said semiconductor substrate, comprising:

said semiconductor substrate, comprised with a first P type concentration, with alternating rows of flat regions and concave regions;

heavily doped, N type, bit line regions, in said flat regions, of said semiconductor substrate;

each of said concave regions, between about 0.2 to 1.0 micron in length, in said semiconductor substrate, located between, and butted to, the heavily doped, N type, bit line regions, in said flat regions of said semiconductor substrate, and with each of said concave regions, between about 1000 to 3000 Angstroms, below the top surface of the heavily doped, N type, bit line regions, located in said flat regions of said semiconductor substrate;

said cell anti-punchthrough, (CPT), region, in each of said concave regions of said semiconductor substrate, with each of said cell anti-punchthrough regions comprised with a second P type concentration, higher in P type dopant concentration than said first P type concentration, in said semiconductor substrate, and with each of said CPT regions located between, and butted to, said heavily doped, N type, bit line regions;

a gate insulator on the surface of said heavily doped, N type, bit line regions, and on the surface of said CPT regions;

a planar polysilicon gate structure on the surface of said gate insulator, traversing and overlying said heavily doped, N type, bit line regions, in first regions of said ROM device structure, and traversing and overlying said cell anti-punchthrough regions in second regions of said ROM device structure, with first portions of said planar polysilicon gate structure, located overlying the flat regions or said semiconductor substrate, comprised with said heavily doped, N type, bit line regions, thinner in thickness than second portions of said planar polysilicon gate structure, overlying the concave regions of said semiconductor substrate, comprised with said cell anti-punchthrough regions; and insulator spacers on sides of said planar polysilicon gate structure.

* * * * *